(12) United States Patent
Khater et al.

(10) Patent No.: US 8,415,748 B2
(45) Date of Patent: Apr. 9, 2013

(54) USE OF EPITAXIAL NI SILICIDE

(75) Inventors: Marwan H. Khater, Astoria, NY (US); Christian Lavoie, Ossining, NY (US); Bin Yang, Ossining, NY (US); Zhen Zhang, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 122 days.

(21) Appl. No.: 12/766,468

(22) Filed: Apr. 23, 2010

(65) Prior Publication Data

US 2011/0260252 A1    Oct. 27, 2011

(51) Int. Cl.
*H01L 21/02* (2006.01)
*H01L 31/07* (2006.01)
*H01L 29/47* (2006.01)

(52) U.S. Cl. . 257/384; 257/382; 257/486; 257/E21.296; 257/E29.271

(58) Field of Classification Search .................. 257/382, 257/384, 486, E21.296, E29.271
See application file for complete search history.

(56) References Cited

U.S. PATENT DOCUMENTS

| | | | |
|---|---|---|---|
| 4,174,422 A | 11/1979 | Matthews et al. | |
| 4,707,197 A * | 11/1987 | Hensel et al. | 117/105 |
| 5,336,637 A | 8/1994 | Nowak | |
| 5,356,837 A | 10/1994 | Geiss et al. | |
| 5,463,254 A * | 10/1995 | Iyer et al. | 257/757 |
| 6,190,979 B1 | 2/2001 | Radens et al. | |
| 6,413,859 B1 | 7/2002 | Cabral, Jr. et al. | |
| 6,534,871 B2 * | 3/2003 | Maa et al. | 257/769 |
| 6,716,708 B2 | 4/2004 | Cabral, Jr. et al. | |
| 6,780,694 B2 | 8/2004 | Doris et al. | |
| 6,828,630 B2 | 12/2004 | Park et al. | |
| 6,858,903 B2 | 2/2005 | Natzle et al. | |
| 6,881,635 B1 | 4/2005 | Chidambarrao et al. | |
| 6,974,737 B2 | 12/2005 | Snyder et al. | |
| 7,071,518 B2 | 7/2006 | Parthasarathy et al. | |
| 7,119,012 B2 | 10/2006 | Carruthers et al. | |
| 7,183,169 B1 | 2/2007 | Waite et al. | |
| 7,202,123 B1 | 4/2007 | Pan | |
| 7,221,024 B1 | 5/2007 | Chidambarrao et al. | |
| 7,238,567 B2 | 7/2007 | Xiong | |
| 7,271,486 B2 | 9/2007 | Cabral, Jr. et al. | |
| 7,419,907 B2 | 9/2008 | Detavernier et al. | |
| 7,446,025 B2 | 11/2008 | Cohen et al. | |
| 7,498,640 B2 | 3/2009 | Cabral, Jr. et al. | |
| 7,544,610 B2 | 6/2009 | Cabral, Jr. et al. | |
| 7,566,629 B2 | 7/2009 | Booth, Jr. et al. | |

(Continued)

OTHER PUBLICATIONS

J. Kedzierski, et al., "Complementary silicide source/drain thin-body MOSFETs for the 20nm gate length regime," IEEE, 2000, pp. 1-4.

(Continued)

*Primary Examiner* — Jerome Jackson, Jr.
*Assistant Examiner* — Paul Budd
(74) *Attorney, Agent, or Firm* — Connolly Bove Lodge & Hutz LLP; Louis J. Percello, Esq.

(57) ABSTRACT

An epitaxial Ni silicide film that is substantially non-agglomerated at high temperatures, and a method for forming the epitaxial Ni silicide film, is provided. The Ni silicide film of the present disclosure is especially useful in the formation of ETSOI (extremely thin silicon-on-insulator) Schottky junction source/drain FETs. The resulting epitaxial Ni silicide film exhibits improved thermal stability and does not agglomerate at high temperatures.

14 Claims, 9 Drawing Sheets

U.S. PATENT DOCUMENTS

| | | | |
|---|---|---|---|
| 7,589,381 | B2 | 9/2009 | Kinoshita et al. |
| 7,652,332 | B2 | 1/2010 | Cartier et al. |
| 2005/0275033 | A1 | 12/2005 | Zhu et al. |
| 2006/0220113 | A1* | 10/2006 | Tamura et al. ............... 257/335 |
| 2007/0267762 | A1* | 11/2007 | Yu et al. ............... 257/E29.148 |
| 2009/0134388 | A1* | 5/2009 | Yamauchi et al. ............. 257/42 |
| 2009/0283841 | A1 | 11/2009 | Yeh et al. |
| 2009/0311836 | A1 | 12/2009 | Cartier et al. |

OTHER PUBLICATIONS

R. Das, et al., Studies on the Electrical Characteristics of Ni and NiPt-alloy Silicided Schottky Diodes, 2006, pp. 1-5.

Daniel Lentz, "Epitaxial Deposition,"(PowerPoint Presentation Slides) Penn State University, Mar. 29, 2007, pp. 1-7.

A. Hsiung, et al., "50 nm Schottky Barrier CMOS with Conventional Silicide," 2002, pp. 1-4.

P. Lim, et al., "Dopant Segregated Schottky (DSS) Source/Drain for Germanium P-MOSFETs with Metal Gate/High-k Dielectric Stack," 2009, (1 page).

Zhang, et al., "Morphological stability and specific resistivity of sub-10 nm silicide films of $Ni_{1-x}Pt_x$ on Si substrate," Applied Physics Letters, 96, 2010, pp. 1-3.

* cited by examiner (Measurement of sheet resistance for 6 nanometer thick Ni and NiPt10% films deposited on Si. The sharp increase of $R_s$ at high temperatures is due to silicide agglomeration.)

(Measurement of sheet resistance for 4 nm thick Ni and NiPt10% films deposited on Si. The sharp increase of $R_s$ of the NiPt10% film at high temperature is due to silicide agglomeration.)

USE OF EPITAXIAL NI SILICIDE

TECHNICAL FIELD

The present disclosure relates to making a sub-10 nanometer silicide source/drain for Schottky junction source/drain FETs in ETSOI (extremely thin silicon-on-insulator) which requires resistance to agglomeration at high temperatures (e.g. temperatures of about 600° Celsius or more).

More generally, the present disclosure relates to electrical contacts for use in semiconductor devices, and more particularly to a method of fabricating an epitaxial Ni silicide film used in such contacts that is resistant to agglomeration at high temperatures (e.g. temperatures of about 600° Celsius or more). Agglomeration resistance allows for the production of thinner metal silicide contacts that are necessary for reducing the dimensions of electronic devices.

BACKGROUND OF THE DISCLOSURE

Current semiconductor technology uses silicides as contacts to the source/drain (S/D) regions and gate electrodes of the devices that are fabricated upon a Si substrate in CMOS transistors. Silicides are metal compounds that are thermally stable and provide for low electrical resistivity at the interface between the Si and the silicide film.

Schottky FETs may have relatively low parasitic resistance and gate-to-drain parasitic capacitance clue to the lack of raised source/drain regions as well as abrupt source/drain junctions. A Schottky barrier height (SBH) at the source/drain junction approaching zero is needed to achieve a competitive current drive in Schottky FET devices. To obtain good electrostatic control for a Schottky FET with an extremely scaled gate length (<30 nanometers), the Schottky FET is fabricated on an extremely thin SOI substrate where the Si available for silicidation is less than about 10 nanometers. Moreover, a 600° Celsius drive-in anneal is required to diffuse implanted dopants (e.g., As for n-FETs) to the silicide/Si channel interface to achieve a sub-100 meV SBH at the S/D Schottky junction. Therefore, it would be desirable to make a silicide source/drain which is resistant to agglomeration at 600° Celsius that can also be fabricated on an extremely thin SOI substrate where the Si available for silicidation is less than about 10 nanometers.

Silicide formation typically requires depositing a transition metal such as Ni, Co or Ti, onto a wafer. Following deposition, the structure is then subjected to an annealing step using conventional processes such as rapid thermal annealing. During thermal annealing, the deposited metal reacts with the Si it is in direct contact with to form a metal silicide.

The term "agglomerate" is used herein to denote that a thin Ni silicide film (e.g. a film having a thickness of less than about 10 nanometers) tends to gather into masses or clusters at temperatures on the order of about 600° Celsius or higher. The agglomeration problem is not limited to Ni silicides. It typically occurs for various thin films other than NiSi and is worst for low melting point materials. Agglomeration is driven by a minimization of surface energy for the same volume of material and occurs for any thin film if the temperature is high enough for diffusion to allow the thin film to take a lower energy configuration. At a given temperature, agglomeration is more important for low melting point material as diffusion typically start around ⅔ of the melting point.

The term "substantially non-agglomerated" is used herein to denote that the resistivity of the epitaxial Ni silicide film remains below 100 microOhms-centimeter at a temperature above 600° Celsius.

Agglomeration is particularly problematic because the manufacture of a functioning device would benefit from processing steps after contact formation where the silicide temperature could withstand 600° Celsius. For instance, interface modification via dopants-segregation is one of the most promising ways to enable the use of one silicide for both types (p-FETs and n-FETs) of Schottky devices. However, to diffuse n-type dopants (e.g. As and/or P) into the silicide/Si interface and maximize the modification of the interface, at least 600° Celsius is needed. Currently, Ni—Pt silicides are used for advanced devices wherein Pt helps limit agglomeration of the silicide contact. However, even Ni—Pt silicides containing 5% or 10% Pt experience agglomeration at temperatures of about 600° Celsius when their thickness is less than about 10 nanometers.

In view of the above, it would be highly desirable to provide a thin Ni silicide contact in a Si-containing material that exhibits thermal stability at high temperatures (e.g. temperatures at or above 600° Celsius), while being easily fabricated utilizing well-known CMOS processing steps.

SUMMARY OF THE DISCLOSURE

The present disclosure provides an epitaxial Ni silicide film for use as an electrical contact to Si and a method for forming an epitaxial Ni silicide film which typically has a thickness of about 10 nanometers or less, and more typically having a thickness of about 3 to about 8 nanometers. The method of the present disclosure forms epitaxial Ni silicide films without experiencing problems associated with the prior art. The epitaxial Ni silicide films of the present disclosure, which do not contain Pt, demonstrate enhanced thermal stability compared to thicker silicides. Moreover, the epitaxial Ni silicide films of the present disclosure exhibit enhanced thermal stability compared to the Ni monosilicide phase containing Pt which is the current solution in the manufacturing state of the art CMOS technology.

One aspect of the present disclosure is an electrical contact to Si comprising an epitaxial Ni silicide film having a thickness of less than about 10 nanometers and wherein the epitaxial Ni silicide film is substantially non-agglomerated (e.g. the resistivity of the epitaxial Ni silicide film remains below 100 microOhms-centimeter) at a temperature above 600° Celsius. The electrical contacts of the present disclosure remain substantially non-agglomerated at high temperatures (e.g. temperatures at or above about 600° Celsius) and exhibit enhanced thermal stability.

A second aspect of the present disclosure is related to a method of making an electrical contact to Si comprising:
  (A) depositing a blanket of pure Ni film having a thickness of less than about 5 nanometers over a structure comprising Si;
  (B) annealing the blanket of Ni film to a temperature of more than about 350° Celsius thereby forming an epitaxial Ni silicide film at a location where the Ni film is in direct contact with the Si; and
  (C) selectively etching to remove unreacted Ni film.

The above method facilitates the formation of an epitaxial Ni silicide film having enhanced thermal stability that is resistant to agglomeration at high temperatures (e.g. temperatures above about 600° Celsius). The above method also facilitates the formation of an electrical contact that is ideal for very small devices when the amount of Si for consumption during the silicidation process is limited.

Another aspect of the present disclosure relates to a Schottky contact to Si comprising an epitaxial Ni silicide film having a thickness of between about 3 nanometers and about 10 nanometers wherein the epitaxial. Ni silicide film is substantially non-agglomerated at a temperature above about 600° Celsius and wherein the Si is either undoped or is doped with a segregated impurity layer at a concentration above about 1E19/centimeter$^3$ between the interface between the Si and the epitaxial Ni silicide film. Again, the resulting epitaxial Ni silicide film exhibits superior thermal stability and remains substantially non-agglomerated at high temperatures (e.g. temperatures at or above about 600° Celsius up to about 900° Celsius).

The Schottky contact of the present disclosure comprises a concentration of impurity of between about 5E21/centimeter$^3$ and about 1E17/centimeter$^3$ at the interface between the Si and the epitaxial Ni silicide film. The impurity of the present disclosure may comprise one or more of B, P, As, In, Se, S, Al, Mg, F, or C. An impurity comprising at least one of P, B, or As is even more typical.

One advantage to the Schottky transistors of the present disclosure is that one type of silicide can be employed for both pMOS and nMOS FETs due to the enhanced thermal stability of the epitaxial. Ni silicide films at the high temperatures (e.g. temperatures at or above about 600° Celsius) required to diffuse dopants (As or P) at the silicide/Si interface of nMOS FETs.

Yet another aspect of the present disclosure relates to field effect transistors and Schottky transistors comprising at least one electrical contact of the present disclosure. Schottky transistors of the present disclosure are advantageous because they exhibit reduced S/D parasitic resistance and have an abrupt junction. Schottky transistors comprising at least one electrical contact of the present disclosure wherein the Si is extremely thin SOI (about 10 nanometers or less) are also contemplated by the present disclosure. Finally, the instant disclosure further contemplates CMOS structures comprising the field effect and Schottky transistors of the present disclosure.

Schottky contacts of the present disclosure can be made according to a method comprising:
  (A) depositing a blanket of a Ni film typically having a thickness of less than about 5 nanometers over a structure comprising Si;
  (B) annealing the blanket of Ni film to a temperature of more than about 350° Celsius thereby forming an epitaxial Ni silicide film at a location where the Ni is in direct contact with Si;
  (C) selectively etching to remove unreacted Ni film;
  (D) implanting an impurity in the epitaxial Ni silicide film; and
  (E) annealing the epitaxial Ni silicide film to diffuse the impurity and concentrate the impurity at an interface between the Si and the epitaxial Ni silicide film.

The impurity utilized in this method comprises at least one of B, P, As, In, Se, S, Al, Mg, F, or C and more typically P, B, or As.

An electrical contact to Si comprising extremely thin silicon-on-insulator (ETSOI) is also provided for by the instant disclosure. In this embodiment, the Si available for silicidation in the source/drain areas is typically less than about 20 nanometers thick and often even less than about 10 nanometers thick.

An electrical contact to Si, wherein the Si is an extremely thin silicon-on-insulator (ETSOI), can be made by a method comprising:
  (A) depositing a blanket of a Ni film, typically having a thickness of less than about 5 nanometers over a structure comprising Si;
  (B) annealing the blanket of Ni film to a temperature of more than about 350° Celsius thereby forming an epitaxial Ni silicide film at a location where the Ni is in direct contact with Si; and
  (C) selectively etching to remove unreacted Ni film.

The epitaxial Ni silicide films of the present disclosure are ideal for use in ETSOI Schottky devices because even though the films are typically less than or equal to about 10 nanometers thick (or more typically, less than or equal to about 8 nanometers thick), they remain substantially non-agglomerated at high temperatures (e.g. temperatures at or above about 600° Celsius). The thickness of the epitaxial Ni silicide films of the present disclosure vary depending on Ni thickness deposited. For instance, deposition of 2 nanometers or 4 nanometers of pure Ni produces an epitaxial Ni silicide film of about 5.5 or about 83 nanometers, respectively. The thickness of the epitaxial Ni silicide film produced depends on the thickness of pure Ni that is deposited.

DESCRIPTION OF BEST AND VARIOUS EMBODIMENTS OF DISCLOSURE

Figure 1A:
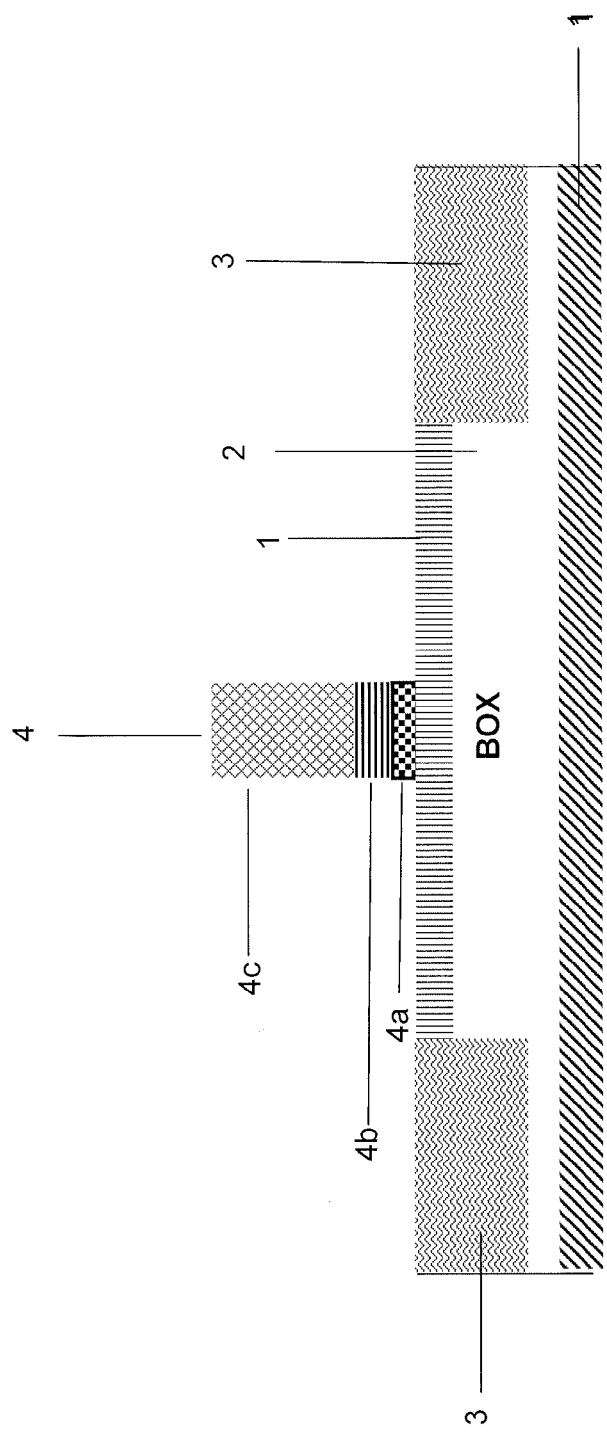
FIG. 1A is a pictorial representation (through a cross-sectional view) of a gate stack formation and patterning for a FET device.

The present disclosure, which is directed to an electrical contact to a Si-containing material comprising an epitaxial Ni silicide film (typically having a thickness of about 10 nanometers or less and more typically of about 8 nanometers or less), and to a method of making the electrical contacts, will now be described in greater detail by referring to the drawings that accompany the present application. It is noted that in the accompanying drawings, like reference numerals are used for describing like and/or corresponding elements.

Reference is first made to FIGS. 1A-1F which illustrate the basic processing steps of the present disclosure that are capable of forming a Schottky transistor device having the electrical contacts of the present disclosure that are resistant to agglomeration at high temperatures (e.g. temperatures above about 600° Celsius). FIG. 1A demonstrates the first steps used to form the Schottky transistor devices of the present disclosure. First, the Si layer 1 above a buried oxide region 2 is thinned to a predetermined thickness of less than about 20 nanometers and even more typically, of less than about 10 nanometers. Second, the STI (shallow trench isolation) regions 3 are formed according to methods well-known in the art. Next, a polysilicon/metal gate/high K gate stack 4 is deposited atop the Si-containing material and a RIE (reactive-ion etching) and patterning processes are performed to form the gate stack 4. The gate stack 4 is comprised of a high-K dielectric material 4a, a metal gate 4b, and a polysilicon material 4c.

Figure 1B:
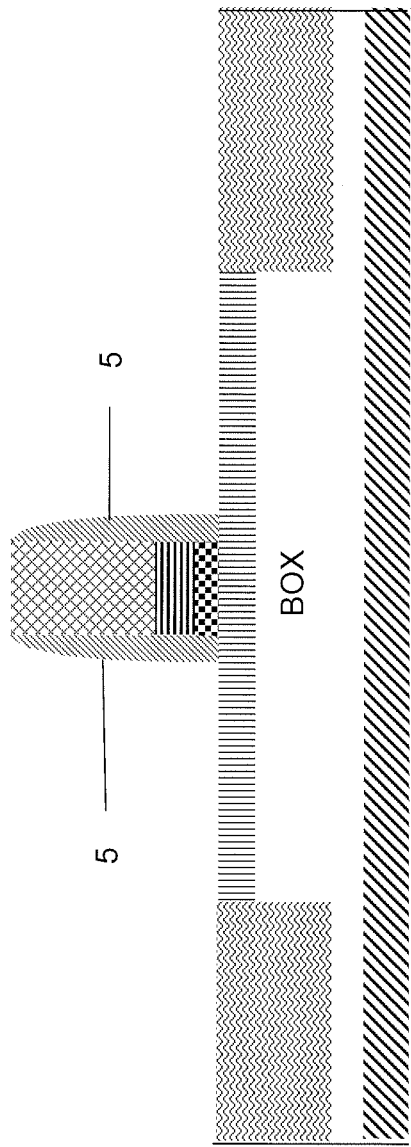
FIG. 1B is a pictorial representation (through a cross-sectional view) illustrating the structure of FIG. 1A after the formation of the nitride spacer.

Next, in FIG. 1B, after the gate stack has been formed, a nitride spacer 5 is deposited on sidewalls of the gate stack. The nitride spacer may be formed by using CVD or another suitable method to deposit a nitride layer (e.g., a conformal layer) on the sidewalls of the gate stack structure. Thereafter, RIE, or another suitable method may be used to remove (e.g., directionally etch) portions of the deposited nitride layer.

Figure 1C:
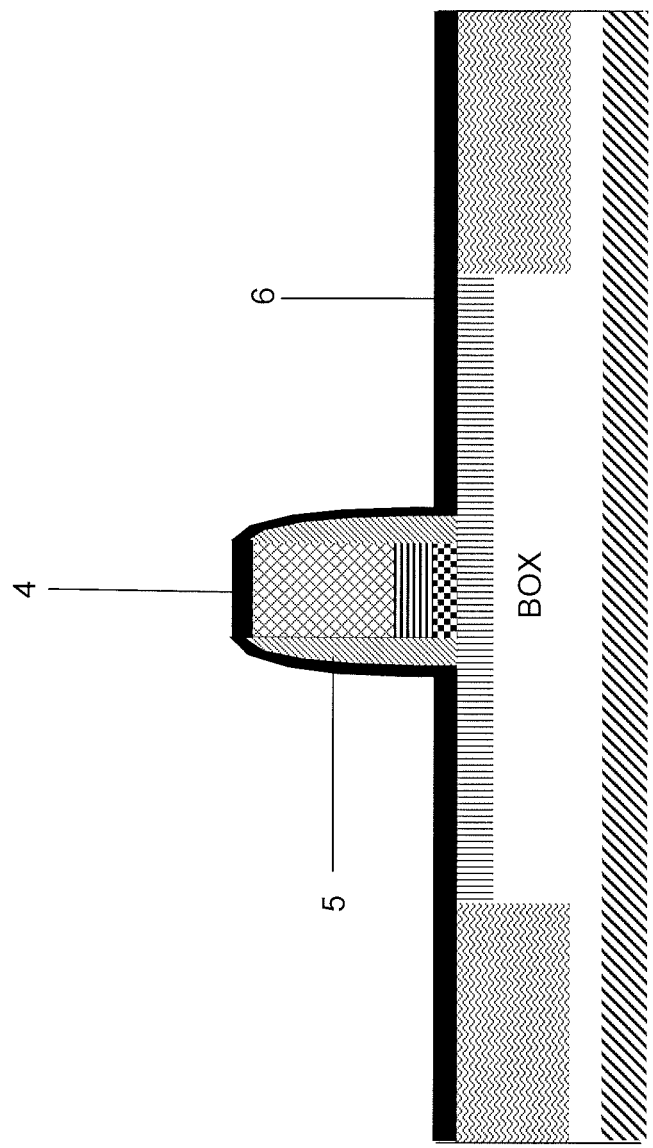
FIG. 1C is a pictorial representation (through a cross-sectional view) illustrating the structure of FIG. 1B after the deposition of the Ni layer to form epitaxial Ni silicide.

FIG. 1C demonstrates the process of depositing the Ni layer 6, having a thickness of 5 nanometers or less, on the surface of the Si 1 and over the gate stack 4 and nitride spacer 5 using conventional deposition processes that are well known to those skilled in the art. For example, the metal layer may be formed by chemical vapor deposition (CVD), plasma-assisted chemical vapor deposition, evaporation, sputtering and other like deposition processes. Of these techniques, it is more typical to deposit the Ni layer by sputtering.

Figure 1D:
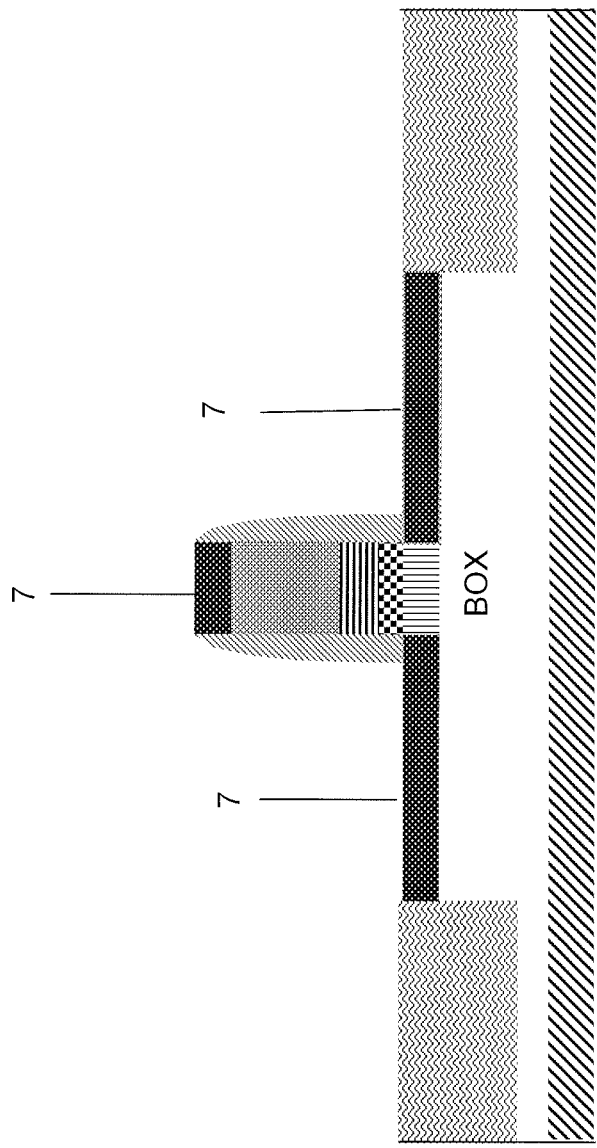
FIG. 1D is a pictorial representation (through a cross-sectional view) illustrating the structure of FIG. 1C after the epitaxial Ni silicide is formed and selectively etched to remove unreacted portions of the Ni layer. In some cases, some Si may remain under the silicide at source/drain to enable the epitaxial structure of the silicide.

In accordance with the next step of the present application, See FIG. 1D, annealing is carried out on the structure shown in FIG. 1C so as to form electrical contacts to Si comprising an epitaxial Ni silicide film 7 typically having a thickness of about 10 nanometers or less and more typically of about 3 to about 8 nanometers The epitaxial Ni silicide film 7 exhibits improved thermal stability over NiPt films as demonstrated by their resistance to agglomeration at high temperatures (e.g. temperatures at or above about 600° Celsius). To form the epitaxial Ni silicide film, annealing is carried out using a rapid thermal processing (RTP), or other conventional annealing processes, using a gas atmosphere, at a temperature of about 350° Celsius for about 5 seconds. Other temperatures and times are also contemplated herein so long as the conditions chosen are capable of forming substantially non-agglomerated epitaxial Ni silicide film. In some cases, some Si May be left underneath the epitaxial Ni silicide film.

Following the formation of the electrical contact a selective etch process is utilized to remove the blanket of unreacted Ni film. It is more typical to use a selective wet etching process. However, other conventional etch processes such as reactive-ion etching (RIE), ion beam etching, or plasma etching can be used. The final thickness of the non-agglomerated epitaxial Ni silicide contact is typically less than about 10 nanometers. The aforementioned silicide formation is compatible with conventional semiconductor processing steps that are well-known within the art and can be utilized to produce, for example, CMOS devices.

Figure 1E:
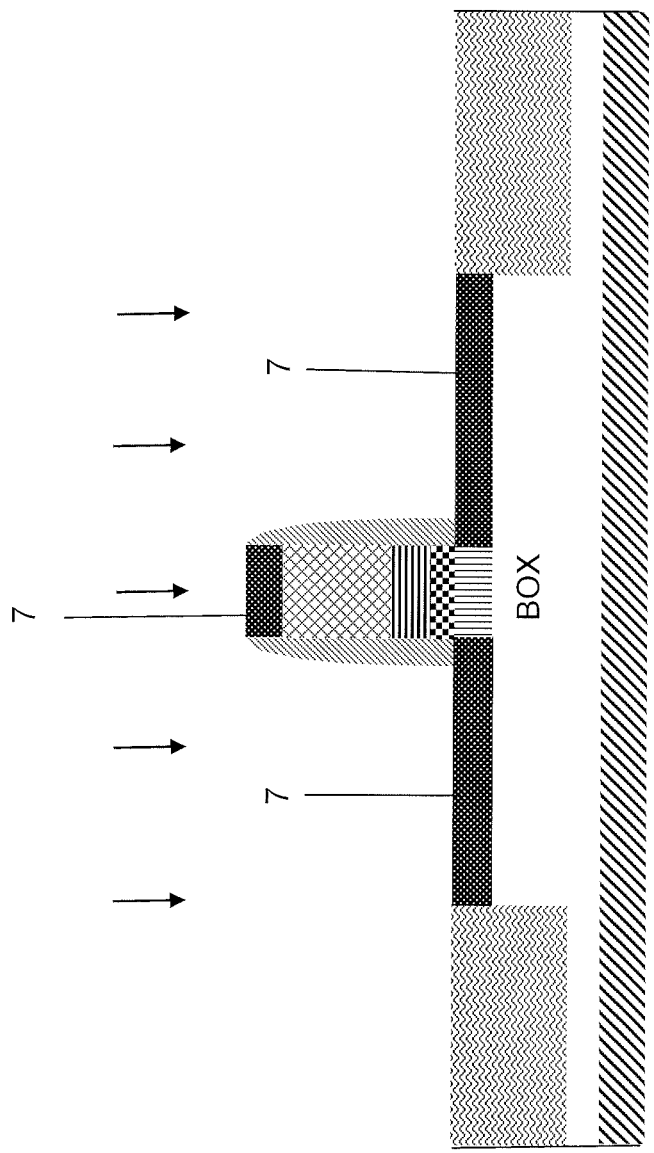
FIG. 1E is a pictorial representation (through a cross-sectional view) illustrating the structure of FIG. 1D during implantation of ions.
Figure 1F:
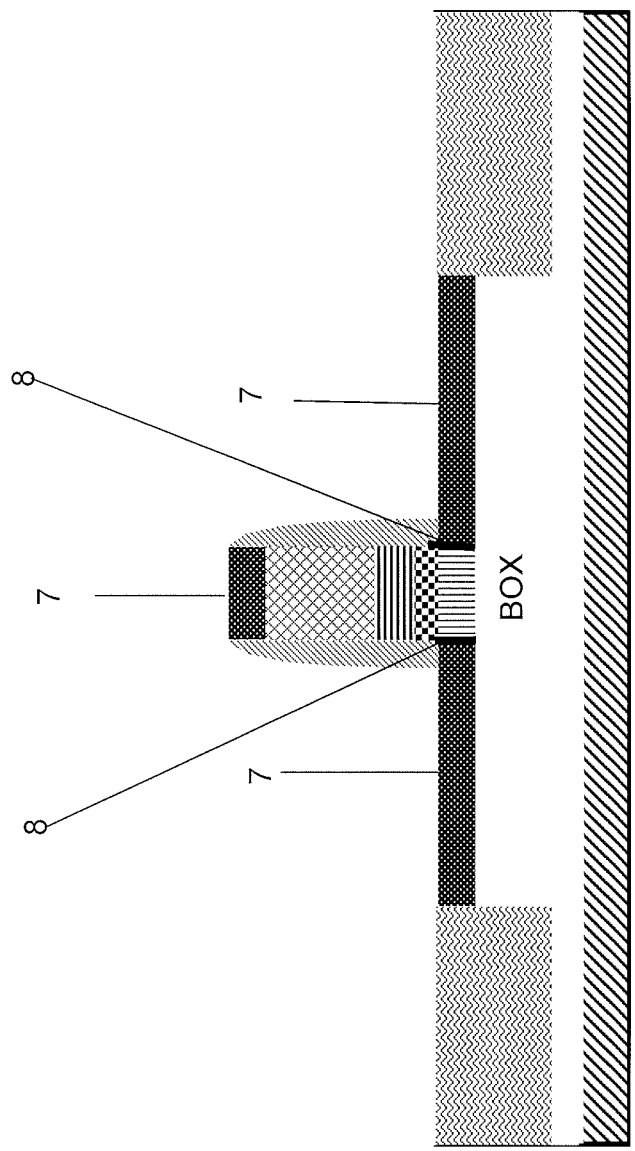
FIG. 1F is a pictorial representation (through a cross-sectional view) of the structure of FIG. 1E after the drive-in anneal. It is also the pictorial representation (through a cross-sectional view) of a Schottky S/D transistor in which the present disclosure can be employed.
Figure 2:
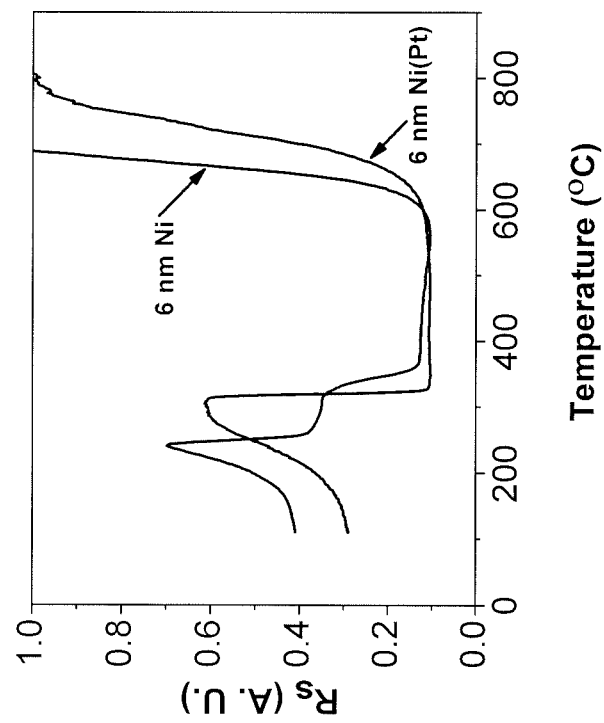
FIG. 2 is a graphical representation of in-situ ramp measurements of silicide formed from 6 nanometers Ni and Ni10% Pt. The graph demonstrates that at 6 nanometers, as well as for thicker metal films, the addition of Pt stabilizes the film only slightly against agglomeration.
Figure 3:
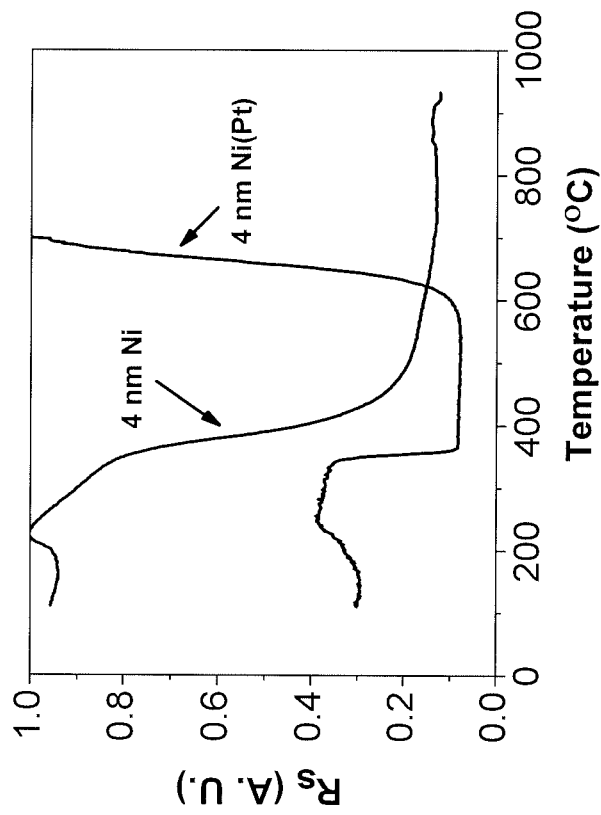
FIG. 3 is a graphical representation of in-situ ramp measurements of silicide formed from 4 nanometers Ni and Ni10% Pt. The graph demonstrates that thermal stability of silicides formed from 5 nanometers or less pure Ni film is much enhanced compared to the Ni10% Pt, and that the pure Ni film remains substantially non-agglomerated at the temperatures where Ni10% Pt begins to agglomerate.
Figure 4:
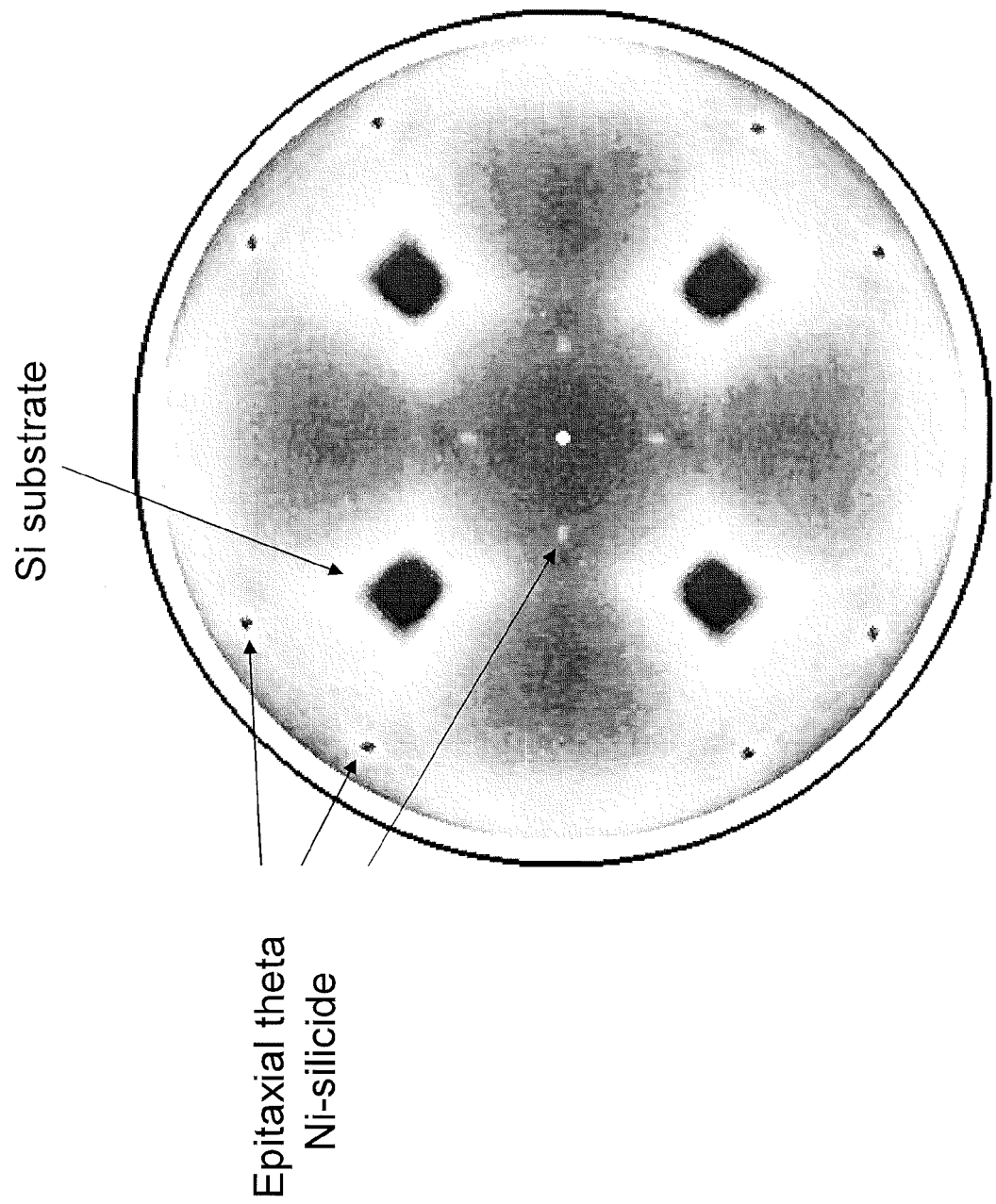
FIG. 4 is a pole figure of silicide formed from less than 5 nanometers pure Ni (epi-Ni$_x$Si$_y$). This figure demonstrates that the pure Ni silicide shows very strong in-plane orientation and aligns with the Si substrate as for an epitaxial film.

In reference to FIG. 1E, transistors of the present disclosure may optionally include dopant-segregation at the interface of the reactive Si-containing material and the epitaxial Ni silicide film. Where dopant segregation at the interface is desired, the transistor depicted in FIG. 1D goes through an ion implantation process wherein ions specific to the type of transistor desired (e.g., B for p-FETs, As or P for n-FETs) are implanted into the epitaxial Ni silicide film 7. The epitaxial Ni silicide film 7 is then annealed to segregate implanted dopants to the silicide/Si interface creating a unique structure wherein the segregated dopants layer 8 is at the silicide and Si channel interface. See FIG. 1F. The single-crystallinity of the Ni silicide gives the silicide higher thermal stability for the post-silicide diffusion of dopants. The conditions for the ion implantation and annealing are well known to those skilled in the art and need not be described herein in any detail.

Still other objects and advantages of the present disclosure will become readily apparent by those skilled in the art from the preceding detailed description, wherein it is shown and described preferred embodiments, simply by way of illustration of the best mode contemplated. As will be realized the disclosure is capable of other and different embodiments, and its several details are capable of modifications in various obvious respects, without departing from the disclosure. Accordingly, the description is to be regarded as illustrative in nature and not as restrictive.

The term "comprising" (and its grammatical variations) as used herein is used in the inclusive sense of "having" or "including" and not in the exclusive sense of "consisting only of." The term "consisting essentially of" as used herein is intended to refer to including that which is explicitly recited along with what does not materially affect the basic and novel characteristics of that recited or specified. The terms "a" and "the" as used herein are understood to encompass the plural as well as the singular.

What is claimed is:

1. A Schottky source/drain contact to Si comprising an epitaxial Ni silicide film having a thickness of between 3 to 8 nanometers wherein the epitaxial Ni silicide film is substantially non-agglomerated at a temperature above about 600° Celsius and has a resistivity of below 100 microOhms-centimeter at a temperature above about 600° Celsius and wherein the Si is either undoped or is doped, with a segregated impurity layer, wherein the segregated impurity layer comprises a concentration of impurity of above about $5E19/centimeter^3$ at the interface between the Si and the epitaxial Ni silicide film.

2. The Schottky source/drain contact according to claim 1 wherein the segregated impurity layer comprises a concentration of impurity of about $5E21/centimeter^3$ to about $1E19/centimeter^3$ at the interface between the Si and the epitaxial Ni silicide film.

3. The Schottky source/drain contact according to claim 2 wherein the impurity comprises at least one of P, B, or As.

4. The Schottky source/drain contact according to claim 1 wherein the impurity comprises at least one of B, P, As, In, Se, S, Al, Mg, F, or C.

5. A Schottky transistor comprising the Schottky source/drain contact according to claim 2.

6. The Schottky transistor according to claim 5 wherein the Si is extremely thin SOI having a thickness of less than or equal to about 10 nanometers.

7. A CMOS device comprising the Schottky transistor according to claim 6.

8. The Schottky transistor according to claim 5 wherein some Si remains underneath the Schottky source/drain contact.

9. A CMOS device comprising the Schottky transistor according to claim 5.

10. A field effect transistor comprising at least one electrical contact to Si comprising an epitaxial Ni silicide film having a thickness of 3 to 8 nanometers and wherein the epitaxial Ni silicide film is substantially non-agglomerated at a temperature above about 600° Celsius and having a resistivity of below 100 microOhms-centimeter at a temperature above about 600° Celsius.

11. A CMOS device comprising the field effect transistor according to claim 10.

12. A CMOS device comprising a Schottky transistor comprising a Schottky source/drain contact to Si comprising an epitaxial Ni silicide film having a thickness of between 3 to 8 nanometers wherein the epitaxial Ni silicide film is substantially non-agglomerated at a temperature above about 600° Celsius and has a resistivity of below 100 microOhms-centimeter at a temperature above about 600° Celsius and wherein the Si is either undoped or is doped, with a segregated impurity layer at a concentration above about $1E19/centimeter^3$ at an interface between the Si and the epitaxial Ni silicide film, wherein the epitaxial Ni silicide film is obtained from a nickel film having a thickness of less than about 5 nanometers.

13. A CMOS device comprising a Schottky transistor comprising a Schottky source/drain contact to Si comprising an epitaxial Ni silicide film having a thickness of between 3 to 8 nanometers wherein the epitaxial Ni silicide film is substantially non-agglomerated at a temperature above about 600° Celsius and has a resistivity of below 100 microOhms-centimeter at a temperature above about 600° Celsius and wherein the Si is either undoped or is doped, with a segregated impurity layer at a concentration above about $1E19/centimeter^3$ at an interface between the Si and the epitaxial Ni silicide film.

14. The Schottky transistor according to claim 13, wherein the Si is extremely thin silicon-on-insulator (ETSOI) having a thickness of less than about 20 nanometers.

\* \* \* \* \*